United States Patent [19]

Kamino et al.

[11] Patent Number: 4,787,333

[45] Date of Patent: Nov. 29, 1988

[54] METAL VAPOR GENERATOR

[75] Inventors: Yukishige Kamino, Tsuchiura; Nobuyuki Hiraishi, Katsuta, both of Japan

[73] Assignee: Hitachi, Ltd., Tokyo, Japan

[21] Appl. No.: 20,883

[22] Filed: Mar. 2, 1987

[30] Foreign Application Priority Data

May 2, 1986 [JP] Japan .................... 61-100947

[51] Int. Cl.$^4$ .................................... C23C 14/24
[52] U.S. Cl. .................................... 118/726
[58] Field of Search ........................ 118/726

[56] References Cited

U.S. PATENT DOCUMENTS

| | | | |
|---|---|---|---|
| 3,647,197 | 3/1972 | Holloway | 118/726 |
| 4,197,814 | 4/1980 | Takagi | 118/726 |
| 4,361,114 | 11/1982 | Gurev | 118/726 |
| 4,484,943 | 11/1984 | Miura | 118/726 |
| 4,668,480 | 5/1987 | Fujiyashu | 118/726 |
| 4,700,660 | 10/1987 | Levchenko | 118/726 |

*Primary Examiner*—Richard Bueker
*Attorney, Agent, or Firm*—Antonelli, Terry & Wands

[57] ABSTRACT

A metal vapor generator of the present invention is constituted to locate an airtight joint between a body with an opening around its top and a bottom plate, in the vicinity of the lower portion of the body. According to such an arrangement, since said airtight joint locates at a side where a powder metal depositing material such as copper, aluminum or the like is filled up within the vessel and whose particle size of the depositing metal material is large, penetration of the particles into the airtight joint is reduced, thereby facilitating the detachment between the bottom plate and the body.

7 Claims, 3 Drawing Sheets

METAL VAPOR GENERATOR

BACKGROUND OF THE INVENTION

The present invention relates to a vapor generator and, more particularly, to a metal vapor generator suitable for depositing a thin film on a semiconductor substrate and the like by a metal vapor deposition process employing a cluster ion beam.

DESCRIPTION OF THE PRIOR ART

Conventionally, in a thin film deposition method with making use of a cluster ion beam it has been practiced to locate within a vacuum chamber maintaining a predetermined degree of vacuum a vapor generating vessel which is of a top lid and a body, to fill such a vapor generating vessel with a depositing metal material, for example, copper, aluminum or the like which generates atomic clusters (massive atomic groups supplied to a deposited object, to heat the metal material from the outside up to a temperature of dissolution and to cause the metal material to vaporize. This vaporized metal material is ejected in the form of a beam (a so-called cluster beam) through an injection nozzle (an opening provided on a top lid while being adiabatically expanded by a difference in pressure between the vacuum chamber and the vessel.

Succeedingly, an electron beam irradiates the cluster beam to partially ionize it so that the metal vapor ejected under the ionized condition may deposit on the deposited object as a thin metal film.

Then, a conventional vapor generating vessel 1 consists of a top lid 1a of flat board and a cylindrical body 1b as shown in FIG. 5, and these top lid 1a and the body 1b are interconnected by screw connection to maintain the airtightness of the vessel. Also, as shown in FIG. 6, there may appear a vessel including a ground joint to hold the airtightness of the vessel. In this manner, refill of stored metal material has been conducted by the detachment of the top lid from the body.

In addition, U.S. Pat. No. 4,490,408 may be cited as a certain related art concerning this kind of deposition treatment apparatus.

In the above-mentioned related art, however, an airtight joint 1d between the top 1a and the body 1b has been located at the upper surface side of the vapor generating vessel. Thus, when the depositing metal material is a high viscous one such as aluminium, small-size numerators or particles fasten on the airtight joint so that the depositing metal material is not to be refilled into the vessel.

In addition to the above, there is a risk to clogging an injection nozzle (an opening) 1c provided on the top lid 1a by the hardened vapor metal because the metal vapor vaporized within the vapor generating vessel 1 is cooled at the region of that nozzle 1c when a temperature around the nozzle 1c has not been elevated. In this connection, such a nozzle in the related art is formed on the flat plate of the lid so that a heat radiation area is increased around the nozzle portion. Owing to such radiation of heat, it cannot be expected the effect of heat concentration on the nozzle portion, whereby there is a possibility of clogging the nozzle. Further, because the joint between the top lid and the body is located on the upper side of the body, the effect of heat transmission is restricted while the side wall of the body is heated.

SUMMARY OF THE INVENTION

An object of the invention is to provide a metal vapor generator which permits detachment between a cover lid and a body to be facilitated, even when using a high viscous metal material, thereby enabling reuse of the vapor generating vessel.

Another object of the present invention is to provide a metal vapor generator adapted to protect a nozzle portion of a vapor generating vessel from clogging the same.

In order to accomplish the above objects, according to the invention, there is provided a metal vapor generator including a vapor generating vessel having an opening which is of body, in the form of an inverted cup, and a bottom plate and adapted to be disposed within a vacuum chamber, wherein said vessel is filled with a depositing metal material, and the side wall of the vapor generating vessel is heated to make metal vapor spout out through the opening of said vessel by a difference in pressure between the vacuum chamber and the vessel, characterized in that said opening is provided around the top of the body and an airtight joint between the bottom plate and the body is located in the vicinity of the lower portion of the body.

DESCRIPTION OF THE PREFERRED EMBODIMENTS

Preferred embodiments of the invention will be fully described hereinafter with reference to FIGS. 1 to 3.

Figure 1:
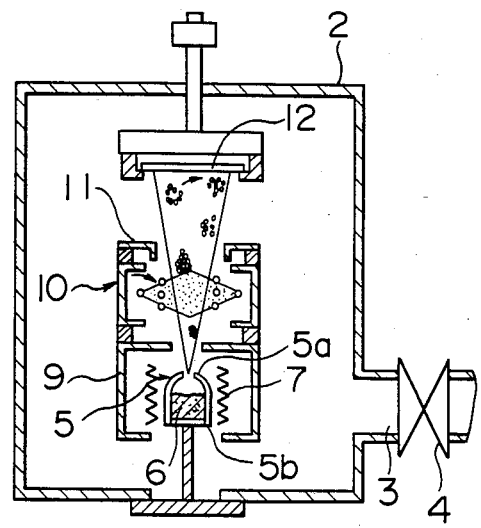
FIG. 1 is a schematic explanatory view showing an example in which a metal vapor generator of the invention is applied to a depositing apparatus utilizing a cluster ion beam deposition method.

FIG. 1 shows one example in which a metal vapor generator of the invention is applied to a thin film depositing apparatus employing a cluster ion beam. Such an apparatus includes a vacuum chamber 2 which maintains a predetermined degree of vacuum, an exhaust duct 3 for discharging air out of the vacuum chamber 2, a vacuum valve 4 opening and closing the exhaust duct 3, and a vapor generating vessel 5 filled with a depositing metal material 6 such as copper, aluminum or the like. The vessel 5 consists of a body 5a, having the form of an inverted cup, and the 5b etc. A reference numeral 7 shows a bombardment filament which irradiates thermoelectrons on the side wall of the vapor generating vessel 5 to heat this vessel. The filament 7 is arranged at the opposite sides of the vessel 5.

Figure 2:
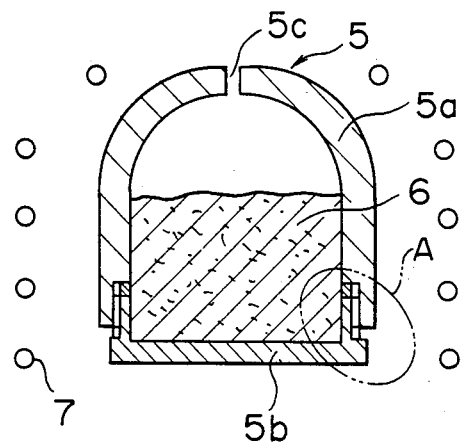
FIG. 2 shows in section an embodiment of a metal vapor generator.
Figure 3:
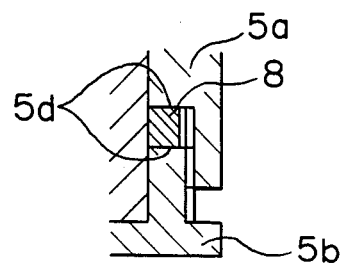
FIG. 3 is an enlarged sectional view of an airtight joint between a cover lid and a body in FIG. 2.

FIGS. 2 and 3 illustrate the details of the afore-mentioned vapor generating vessel 5.

The body 5a, having the form of an inverted cup, is made tapering upwardly, for example like a dome shape whose axial apex is provided with a nozzle 5c having a small diameter. And, the bottom plate 5b is formed cylindrically. An airtight joint 5d between the body 5a and the bottom plate 5b is located at the lower side of the body 5a or at a side where the depositing material 6 is filled up. Also, a seal member 8 is inserted in the airtight joint 5d to enhance the degree of airtightness. The bombardment filament 7 extends along the side wall of the dome-shaped body 5a.

Referring again to the thin film depositing apparatus, the apparatus is further provided with a heat shielding plate 9 to isolate the radiant heat from the filament 7, ionization means 10 for ionizing the clusters spouted out of the vessel 5, and acceleration electrodes 11 which accelerate the ionized cluster ions and cause them to collide against a deposited object 12 and to form the thin film on its surface.

The operation of the above embodiment of the invention will be explained hereinunder.

Such operation begins by filling the vapor generating vessel 5 with the depositing metal material 6 of a metal to be deposited and opening the vacuum valve 4 to exhaust the air from the vacuum chamber 2.

Then, the depositing material 6 within the vessel 5 is so heated up to about 2000° C. by means of the bombardment filament 7 as to be vaporized. At this time, since the body 5a is formed like a dome and the filament 7 is disposed parallel to the side wall of the body, a heated area on the body is enlarged so that the heat acts effectively on the nozzle 5c and is expected to realize the effect of heat concentration on the nozzle, thereby preventing the nozzle 5c from clogging with the depositing material.

After a temperature within the vessel 5 has been raised in such an extent that a metal vapor pressure head comes to 0.1–10 Torr, the metal vapor ejected from the nozzle 5c is adiabatically expanded by a difference in pressure between the vessel 5 and the vacuum chamber 2 to form massive atomic groups of the so-called clusters which are of a great number of linked atoms. This cluster beam accelerates the cluster ions ionized by the ionization means 10 and the acceleration electrodes 11 to collide them against the deposited object 12 so that the thin film of the metal is deposited on that member.

According to the present invention, the airtight joint 5d between the body 5a and the bottom plate 5b, both of which constitute the vapor generating vessel 5, is arranged to be located at the lower side of the body 5a or at the side where the depositing material is filled up. For that reason, even when the depositing metal material 6 is high in viscosity, the particles of the material remain in large size and penetration of the particles into the airtight joint is reduced, thereby facilitating detachment of the bottom plate from the body. Accordingly, it is possible to refill the vapor generating vessel with a depositing metal material and repeatedly employ the same. In this connection, in the conventional vapor generating vessel as has been stated in the above, the airtight joint between the cover lid and the body is provided on the upper side of the body, that is, at the position where the depositing metal is not accumulated, so that the small molecules of the metal particles or the atomic particles of the metal vapor tend to penetrate into the airtight joint.

In the above embodiment of the invention when such a seal member 8 is additionally set on the airtight joint 5d, the detachment between the bottom plate and the body is more readily done with small shearing force than the case with no seal member because a fastening surface of the depositing metal member is decreased in area.

Figure 4:
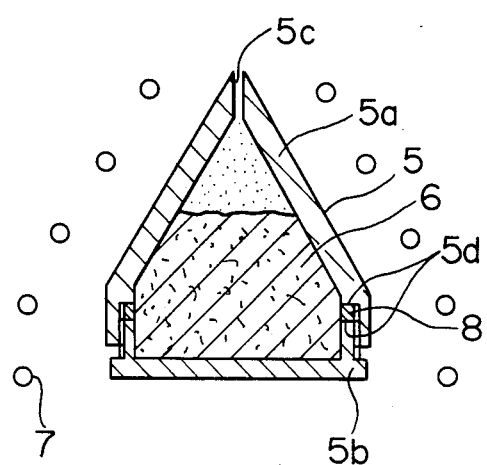
FIG. 4 is a sectional view showing another embodiment of a metal vapor generator according to the present invention.
Figure 5:
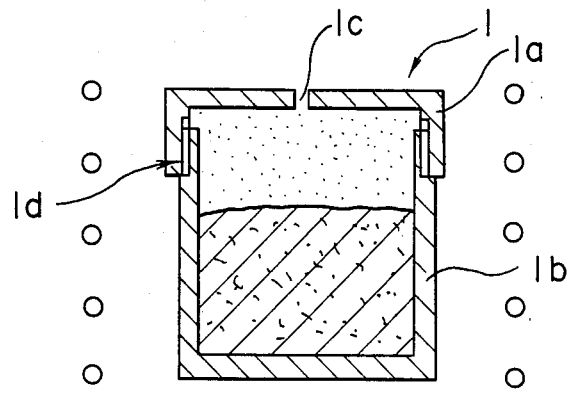
FIGS. 5 and 6 are explanatory views showing conventional metal vapor generators, respectively.
Figure 6:
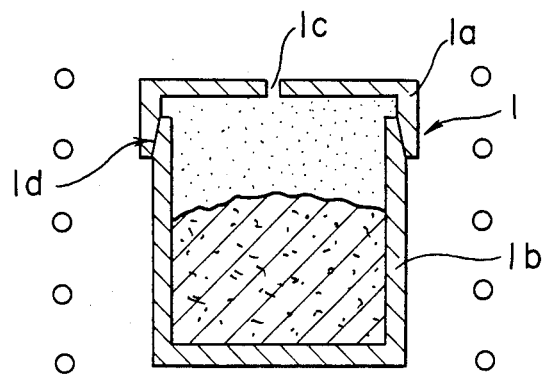

FIG. 4 shows another embodiment of the invention in which a shape of a vessel body is made in the form of an inverted cone.

As the result of defining a vessel body in this manner, heat supplied to a nozzle portion affects effectively, and further, the effect of heat concentration on the nozzle is expected.

According to the present invention, since an airtight joint between a body and a bottom plate both of which constitute a vapor generating vessel is provided to be located in the vicinity of the lower portion of the body, even when a high viscous metal material to be deposited is used, such an arrangement facilitates detachment between the cover lid and the body and enables the vapor generating vessel to reuse.

Therefore, it is possible to obtain advantages for a cost effect and so on when the metal vapor generator of the present invention is applied to cluster ion beam depositing apparatus employing a cluster ion beam deposition method.

What is claimed is:

1. A metal vapor generator including a vapor generating vessel having an opening, the vapor generating vessel being formed of a body and of a bottom plate, the bottom plate covering the bottom of the body, said opening being formed in the body, the vapor generating vessel being disposed within a vacuum chamber and being adapted to contain a depositing metal material, and heating means for heating the side wall of the vapor generating vessel so as to make metal vapor spout out through the opening of said vapor generating vessel by a difference in pressure between the vacuum chamber and the vapor generating vessel, characterized in that said opening is provided around the top of the body, the body being in the form of an inverted cup, and an airtight joint between the bottom plate and the body in the form of an inverted cup is located in the vicinity of a lower portion of the body in the form of an inverted cup, the bottom plate being detachable from the body in the form of an inverted cup, whereby the vapor generating vessel can be refilled and repeatedly employed.

2. A metal vapor generator according to claim 1, characterized in that in the airtight joint between the body in the form of an inverted cup and the bottom plate a seal member is inserted.

3. A metal vapor generator according to claim 1 or 2, characterized in that the body in the form of an inverted cup is made in the form of a taper.

4. A metal vapor generator according to claim 3, characterized in that the body in the form of an inverted cup is made in the form of a dome.

5. A metal vapor generator according to claim 3, characterized in that the body in the form of an inverted cup is made in the form of an inverted cone.

6. A metal vapor generator according to claim 1, wherein said depositing metal material is disposed in the vapor generating vessel up to a predetermined level, and the airtight joint between the bottom plate and the body in the form of an inverted cup is below said predetermined level.

7. A metal vapor generator according to claim 1, wherein the only airtight joint of the vapor generating vessel is said airtight joint located in the vicinity of the lower portion of the body in the form of an inverted cup.

* * * * *